United States Patent
Uzoh et al.

(10) Patent No.: US 6,630,059 B1
(45) Date of Patent: Oct. 7, 2003

(54) WORKPEICE PROXIMITY PLATING APPARATUS

(75) Inventors: Cyprian Emeka Uzoh, Milpitas; Homayoun Talieh, San Jose; Bulent Basol, Manhattan Beach; Douglas W. Young, Sunnyvale, all of CA (US)

(73) Assignee: Nutool, Inc., Milpitas, CA (US)

( * ) Notice: Subject to any disclaimer, the term of this patent is extended or adjusted under 35 U.S.C. 154(b) by 0 days.

(21) Appl. No.: 09/483,095

(22) Filed: Jan. 14, 2000

(51) Int. Cl.$^7$ .................. C25D 17/00; C25D 17/04; C25B 11/00; C25B 11/12
(52) U.S. Cl. ............... 204/212; 204/217; 204/224 R; 204/284; 204/290.01; 204/275.1; 204/292; 204/294; 204/297.01
(58) Field of Search ............... 204/212, 215–217, 204/284, 275.1, 290.01, 224 R, 292, 294, 297.01

(56) References Cited

U.S. PATENT DOCUMENTS

| | | | | |
|---|---|---|---|---|
| 2,540,602 A | * | 2/1951 | Thomas et al. | 204/224 R |
| 2,689,215 A | * | 9/1954 | Bart | 204/212 |
| 2,726,200 A | * | 12/1955 | Holsapple | 204/224 R |
| 4,235,691 A | * | 11/1980 | Loqvist | 204/212 |
| 4,441,975 A | | 4/1984 | Carter et al. | 204/206 |
| 4,948,487 A | * | 8/1990 | Imazu et al. | 204/206 |
| 5,171,412 A | | 12/1992 | Talieh et al. | 204/192 |
| 5,429,733 A | | 7/1995 | Ishida | 204/234 |

(List continued on next page.)

FOREIGN PATENT DOCUMENTS

| | | |
|---|---|---|
| DE | 43 24 330 | 2/1994 |
| DE | 44 17 551 | 11/1995 |
| EP | 0 374 535 | 6/1990 |
| EP | 1 072 695 | 1/2001 |
| JP | 53 04644 | 4/1978 |
| JP | 06 146065 | 5/1994 |
| JP | 11 012793 | 1/1999 |
| WO | WO 01 13416 | 2/2001 |

OTHER PUBLICATIONS

J.M. Steigerwald, et al., "Pattern Geometry Effects in the Chemical–Mechanical Polishing of Inlaid Copper Structures", Oct. 1994, pp. 2842–2848.
Alan C. West, et al., "Pulse Reverse Copper Electrodeposition in High Aspect Ration Trenches and Vias", Sep. 1998, pp. 3070–3073.
Robert C. Contolini, et al., "Electrochemical Planarization for Multilevel Metallization", Sep. 1994, pp. 2503–2510.
C. Madore, et al., "Blocking Inhibitors in Catholic Leveling", I. "Theoretical Analysis", Dec. 1996, pp. 3927–3942.

*Primary Examiner*—Donald R. Valentine
(74) *Attorney, Agent, or Firm*—Pillsbury Winthrop LLP (57) ABSTRACT

The present invention relates to methods and apparatus for plating a conductive material on a semiconductor substrate by rotating pad or blade type objects in close proximity to the substrate, thereby eliminating/reducing dishing and voids. This is achieved by providing pad or blade type objects mounted on cylindrical anodes or rollers and applying the conductive material to the substrate using the electrolyte solution disposed on or through the pads, or on the blades. In one embodiment of the invention, the pad or blade type objects are mounted on the cylindrical anodes and rotated about a first axis while the workpiece may be stationary or rotate about a second axis, and metal from the electrolyte solution is deposited on the workpiece when a potential difference is applied between the workpiece and the anode. In another embodiment of the present invention, the plating apparatus includes an anode plate spaced apart from the cathode workpiece. Upon application of power to the anode plate and the cathode workpiece, the electrolyte solution disposed in the plating apparatus is used to deposit the conductive material on the workpiece surface using cylindrical rollers having the pad or blade type objects.

30 Claims, 6 Drawing Sheets

U.S. PATENT DOCUMENTS

| | | | |
|---|---|---|---|
| 5,558,568 A | 9/1996 | Talieh et al. | 451/303 |
| 5,650,039 A | 7/1997 | Talieh | 156/636 |
| 5,692,947 A | 12/1997 | Talieh et al. | 451/41 |
| 5,755,859 A | 5/1998 | Brusic et al. | 106/1.22 |
| 5,807,165 A | 9/1998 | Uzoh et al. | 451/41 |
| 5,833,820 A | 11/1998 | Dubin | 204/212 |
| 5,863,412 A | 1/1999 | Ichinose et al. | 205/652 |
| 5,930,669 A | 7/1999 | Uzoh | 438/627 |
| 5,933,753 A | 8/1999 | Simon et al. | 438/629 |
| 6,004,880 A | 12/1999 | Liu et al. | 438/692 |

* cited by examiner

WORKPEICE PROXIMITY PLATING APPARATUS

FIELD OF THE INVENTION

The present invention relates to methods and apparatus for plating a conductive material on a semiconductor substrate. More particularly, the present invention is directed to "proximity plating" methods and apparatus for plating the conductive material on the semiconductor substrate. The substrate is plated with the conductive material as the pad and/or blade type objects are rotated in close proximity to the substrate.

BACKGROUND OF THE INVENTION

A conventional process step in the manufacturing of integrated circuits and devices involves plating a conductive layer on a semiconductor substrate. Plating the substrate with the conductive material over a seed layer has important and broad application in the semiconductor industry. Traditionally, aluminum and other metals are deposited as one of many conductive layers that make up a semiconductor chip. However, in recent times, there is great interest in copper deposition for interconnects on semiconductor chips, because, compared to aluminum, copper reduces electrical resistance and allows semiconductor chips to run faster with less heat generation, resulting in a significant gain in chip capacity and efficiency.

Typically, the semiconductor substrate has been previously etched and contains many holes and/or trenches on its surface. One goal of plating is to uniformly fill the holes and trenches with the conductive material.

Figure 1A:
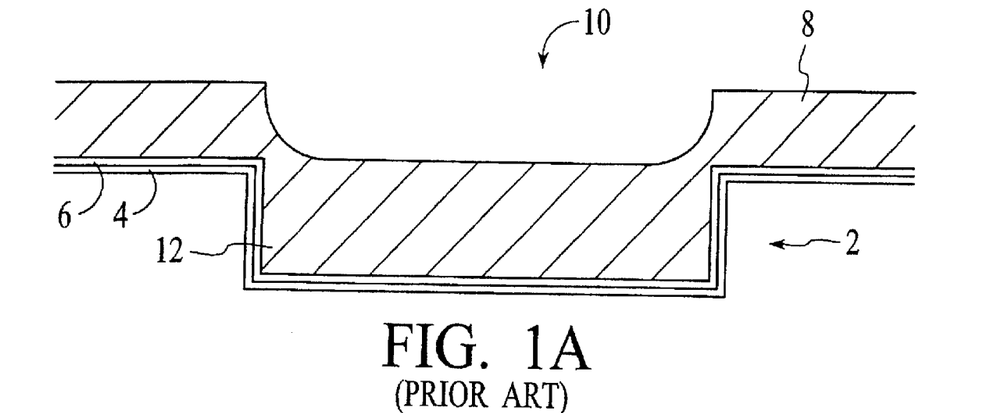
FIG. 1A illustrates a cross sectional view of a conductive layer disposed on a substrate with "dishing" characteristics.

However, as known in the art, conventional plating methods result in "dishing" or non-planar deposition during the plating process. In FIG. 1A, a barrier layer 4 and a seed layer 6 is disposed upon a substrate 2, where a section of the substrate 2 includes a trench 12. After forming the barrier layer 4 and the seed layer 6, a conductive layer 8 is plated on top of the seed layer 6. Because the trench 12 may be relatively large, a recess 10 is formed thereon and dishing results.

Figure 1B:
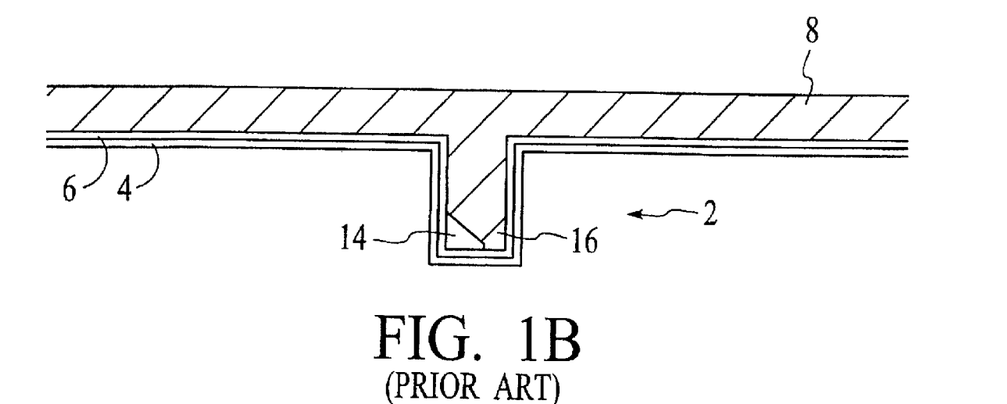
FIG. 1B illustrates a cross sectional view of a substrate having a hole containing a void therein.

For small features with sub-micron size dimensions, existence of voids in the deposited conductive layer is a common problem. In FIG. 1B, such a void 14 is formed near the bottom of a narrow hole 16. It is well known that the existence of such voids in the deposited conductive layer results in defective devices with poor performance. Accordingly, the present invention provides a more accurate, fast, cost effective, and reliable manner of applying the conductive material to the semiconductor substrate.

SUMMARY OF THE INVENTION

It is an object of the present invention to provide methods and apparatus that deposit a conductive material on a substrate with the pad or blade type objects rotating in a circular manner.

It is another object of the present invention to provide methods and apparatus that deposit a conductive material on a substrate while eliminating/reducing dishing and voids.

It is yet another object of the present invention to provide methods and apparatus that deposit a conductive material on a substrate using novel pad-anode or blade-anode assemblies.

These and other objects of the present invention are obtained by providing methods and apparatus for depositing a conductive material from an electrolyte solution to the substrate. This is achieved by providing pad or blade type objects mounted on cylindrical anodes or rollers and applying the conductive material to the substrate using the electrolyte solution disposed on or through the pads or on the blades.

An apparatus that performs such plating includes anodes and a cathode workpiece that are in close proximity of each other. The pad or blade type objects mounted on the cylindrical anodes or rollers rotate about a first axis and the workpiece may be stationary or rotate about a second axis, and metal from the electrolyte solution is deposited on the workpiece when a potential difference is applied between the workpiece and the anode.

Alternatively, the plating apparatus may include an anode plate spaced apart from the cathode workpiece. Upon application of power to the anode plate and the cathode workpiece, the electrolyte solution disposed in the plating apparatus is used to deposit the conductive material on the workpiece surface using cylindrical rollers having the pad or blade type objects.

Further, in another embodiment, the plating apparatus may include an anode plate spaced apart from cylindrical cathodes having conductive pads or blades. Upon application of power to the anode plate and the cathodes and upon rotating the cathodes in a circular direction, the conductive pads or blades make electric contact to the workpiece surface rendering it cathodic with respect to the anode plate, and metal from an electrolyte solution is deposited on the same surface.

BRIEF DESCRIPTION OF THE DRAWINGS

These and other objects and advantages of the present invention will become apparent and more readily appreciated from the following detailed description of the presently preferred exemplary embodiments of the invention taken in conjunction with the accompanying drawings, of which.

DETAILED DESCRIPTION OF THE PREFERRED EMBODIMENTS

The preferred embodiments of the present invention will now be described with reference to FIGS. 2–8. The inventors of the present invention herein disclose methods and apparatus for "proximity plating" a conductive material on a semiconductor substrate. The present invention contemplates different embodiments to be used to plate/deposit a conductive material onto the substrate and into the contacts, vias, holes, trenches, and the like. While the present invention can be used with any conductive material, it is especially suited for use with copper as the conductor and for use in the fabrication of VLSI and ULSI integrated circuits having submicron size features. Furthermore, semiconductor workpieces such as a wafer, a flat panel, magnetic film head, or the like may be used in accordance with the present invention.

An example of a proximity plating method and apparatus is disclosed in a co-pending U.S. application Ser. No. 09/285,621, entitled "Method and Apparatus For Plating and Polishing a Semiconductor Substrate", commonly owned by the assignee of the present invention, the contents of which are expressly incorporated herein by reference. The present invention discloses alternative embodiments.

Figure 2:
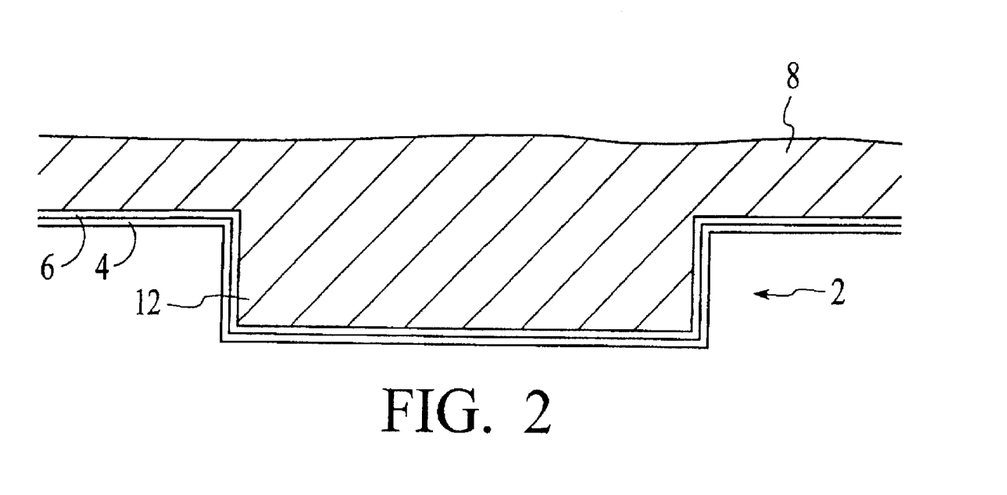
FIG. 2 illustrates a cross sectional view of a substrate having a conductive layer where dishing is eliminated/reduced.

One object of the present invention is to eliminate dishing. FIG. 2 illustrates a cross sectional view of a substrate where dishing is eliminated/reduced as the conductive layer 8 is deposited onto the substrate 2. A relatively uniform flat conductive layer 8 can be obtained by plating the conductive material at a high mass transfer rate, as described in more detail in the present invention. Another object of the present invention is to eliminate voids in the plated material. Eliminating/reducing dishing and eliminating voids are highly desirable in order to manufacture a high quality integrated circuit/device.

Figure 3:
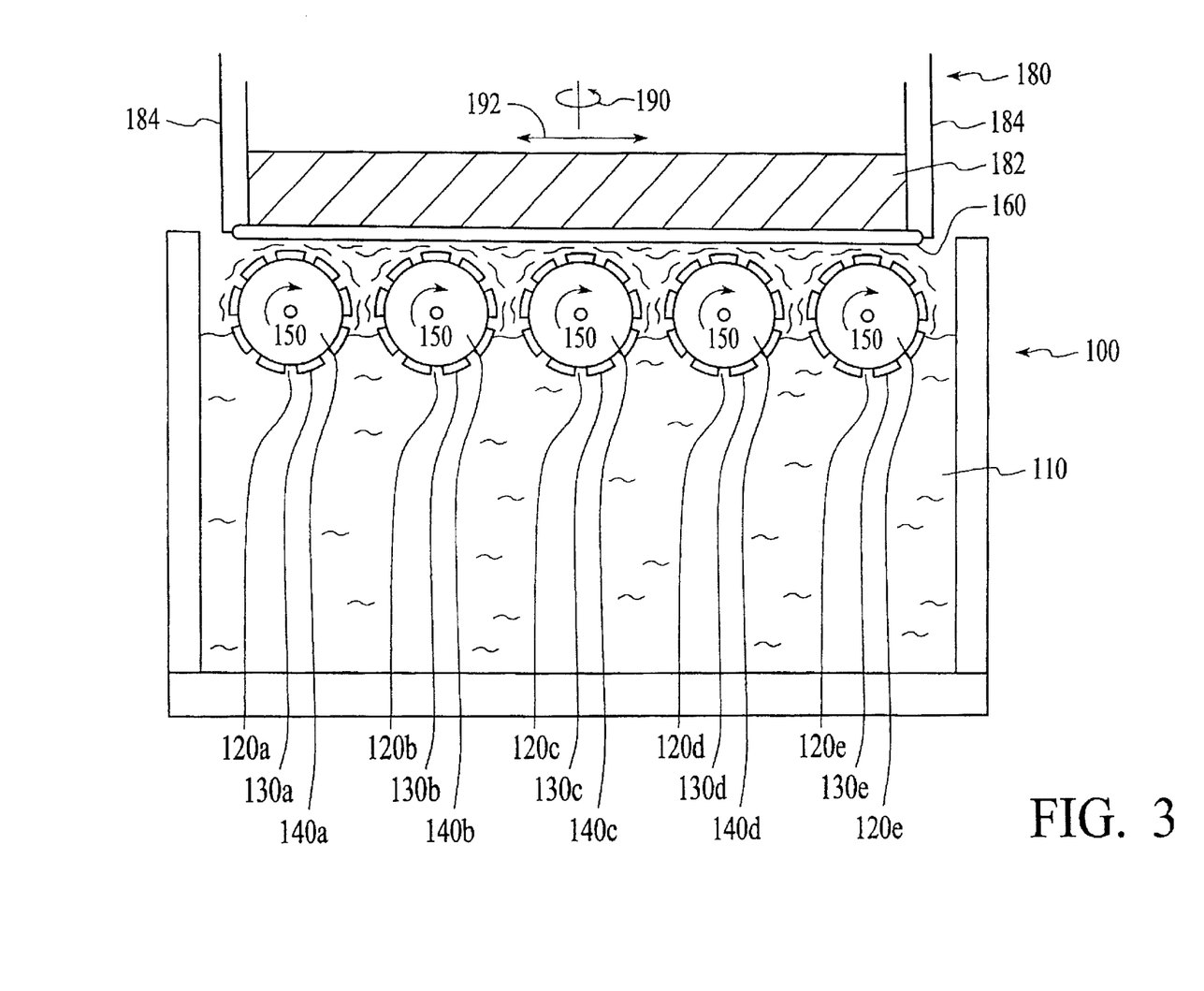
FIG. 3 illustrates a cross sectional view of a "proximity plating" apparatus in accordance with the first preferred embodiment of the present invention.

FIG. 3 illustrates a cross sectional view of a "proximity plating" apparatus in accordance with the first preferred embodiment of the present invention. FIG. 3 illustrates a nonconductive chamber 100 having an electrolyte solution 110 disposed therein. The chamber 100 includes anode assemblies 120a, 120b, etc., having multiple strips of pads 130a, 130b, etc., mounted, or machined onto the cylindrical anodes 140a, 140b, etc. The cylindrical anodes 140a, 140b, etc., may be hollow cylinders formed from conductors such as carbon and titanium having a diameter between 10 to 30 mm.

As shown, the cylindrical anodes 140a, 140b, etc., are in partial contact with the electrolyte solution 110. In other words, the top level of the electrolyte solution 110 is below the surface of a workpiece 160 (i.e., the top level of the electrolyte solution 110 does not make direct contact with the workpiece surface when the cylindrical anodes 140a, 140b, etc., are stationary). Alternatively, the electrolyte solution 110 may be making contact with the workpiece 160 surface.

During operation, a voltage is applied between the cylindrical anodes 140a, 140b, etc., and a cathode workpiece 160. Electrical contact to the cathode workpiece 160 is made via cathode contacts 184. When the anodes 140a, 140b, etc., and the pad strips (or pads) 130a, 130b, etc., are rotating about axis 150 in either a clockwise or counterclockwise direction, and are spaced apart from the cathode workpiece 160 (the pad strips 130a, 130b, etc. do not make direct contact with the workpiece 160, or alternatively, make only slight contact), the workpiece 160 is plated using the electrolyte solution 110.

The anodes 140a, 140b, etc. and the pad strips 130a, 130b, etc. should preferably rotate at a rate such that the electrolyte solution 110 is continuously "picked" by the anodes 140a, 140b, etc., and applied/splashed onto the workpiece 160. They may all rotate in the same clockwise or counterclockwise direction or alternatively, some may rotate in one direction (i.e., clockwise) while others may rotate in the opposite direction (i.e., counterclockwise). Further, during operation, one, two, three, . . . , or all anodes 140a, 140b, etc., may be activated concurrently and voltages may be applied to all or only a selected number of them. Anode current densities for different anodes 140a, 140b, etc., may vary, and this can be used to control the uniformity of the deposited material across the workpiece 160. In addition, the length of the anodes 140a, 140b, etc., may all be the same or they may be different.

When the gaps between the pads 130a, 130b, etc., and the workpiece 160 are about 0–5 mm and contains a meniscus of electrolyte solution 110, a very high mass transport results, thereby depositing high quality metal films onto the workpiece 160. Moreover, when electric power is applied to the cylindrical anodes 140a, 140b, etc., and the cathode workpiece 160, a closed electrical circuit is formed through the anode assemblies 120a, 120b, etc., the applied/splashed electrolyte solution 110 in the gaps, and the workpiece 160. This is described in more detail below. Moreover, depending on the type, shape, and structure of the pads 130a, 130b, etc., the gaps may be greater than 5 mm.

The workpiece head assembly 180 may include a nonconductive, preferably circular chuck 182 with a cavity that is preferably a few millimeters deep at its center and which cavity may contain a resting pad (not shown). The workpiece 160 is loaded into the cavity, backside first, against the resting pad using a conventional type of transport or vacuum mechanism to ensure that the workpiece 160 is stationary with respect to the workpiece head assembly 180 while in use. A nonconductive retaining ring (not shown) such as an O-ring or other rubber type of seal at the periphery of the workpiece head assembly 180 and the cathode contacts 184 each push against the edge of the workpiece 160 and hold it in place. The entire back side of the workpiece 160 which pushes against the chuck 182 that is under the retaining ring is thus protected from any and all solutions, including electrolyte. Other conventional workpiece head assemblies can be used in accordance with the present invention.

As shown, the workpiece head assembly 180 faces toward the anode assemblies 120a, 120b, etc. The head assembly 180 may be stationary or rotate around axis 190 using a conventional motorized spindle (not shown). The head assembly 180 may also be adapted to move up and down and/or side to side in the direction of arrow 192 so that the workpiece 160 may be plated more effectively.

Instead of using the cathode contacts 184 described above, the electric potential can be applied to the workpiece 160 using a ring conductor. Further, other methods of applying the electric potential to the workpiece may be used in accordance with the present invention. For example, a liquid conductor or an inflatable tube coated with a conductive material may be used in the present invention. An example of using the liquid conductor or the conductive tube to provide the necessary electric potential is disclosed in the co-pending U.S. application Ser. No. 09/283,024, now U.S. Pat. No. 6,251,235 issued Jun. 26, 2001, entitled "Method And Apparatus For Forming an Electric Contact With a Semiconductor Substrate", commonly owned by the assignee of the present invention, the contents of which are expressly incorporated herein by reference. What is important to note from the previous examples is that any method for providing an electric potential between the anode or anodes and the cathode workpiece can be used in the present invention.

Figure 4A:
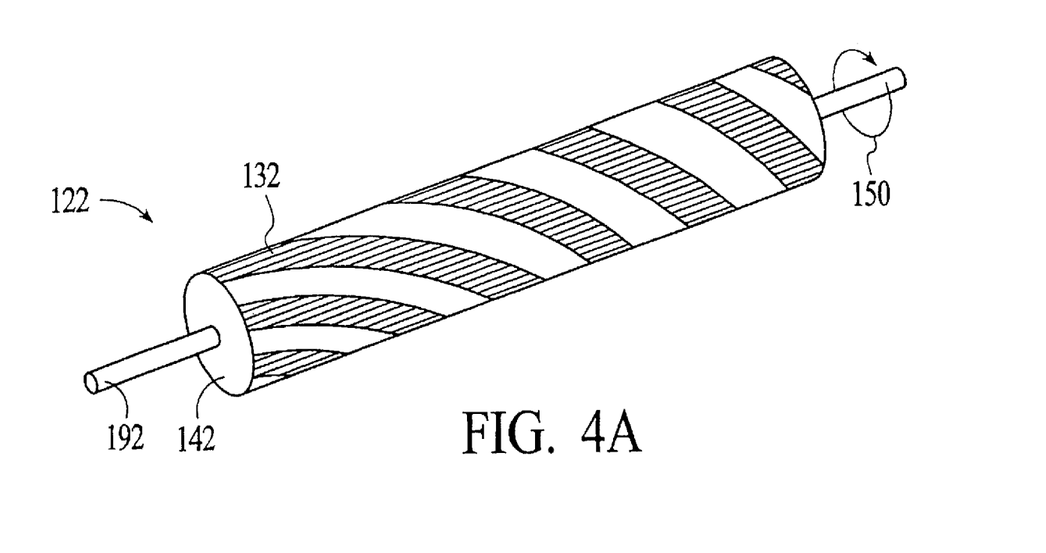
FIGS. 4A–4B illustrate perspective views of pad-anode assemblies in accordance with the preferred embodiment of the present invention.

FIG. 4A illustrates a perspective view of a first pad-anode assembly in accordance with the present invention. An anode assembly 122 (120a, 120b, etc. in FIG. 3) includes a unique pad-anode arrangement for plating the workpiece 160. Multiple strips of pad 132 (130a, 130b, etc. in FIG. 3) are attached, glued, or machined onto a cylindrical anode 142 (140a, 140b, etc. in FIG. 3) such that the pads 132 protrude from the outer surface of the anode 142. In this arrangement, the pads 132 are formed on the anode 142 in a circular manner such that the pads 132 wrap around the anode 142. The cylindrical anode 142 is further connected to a shaft 192 for rotating about axis 150.

Figure 4B:
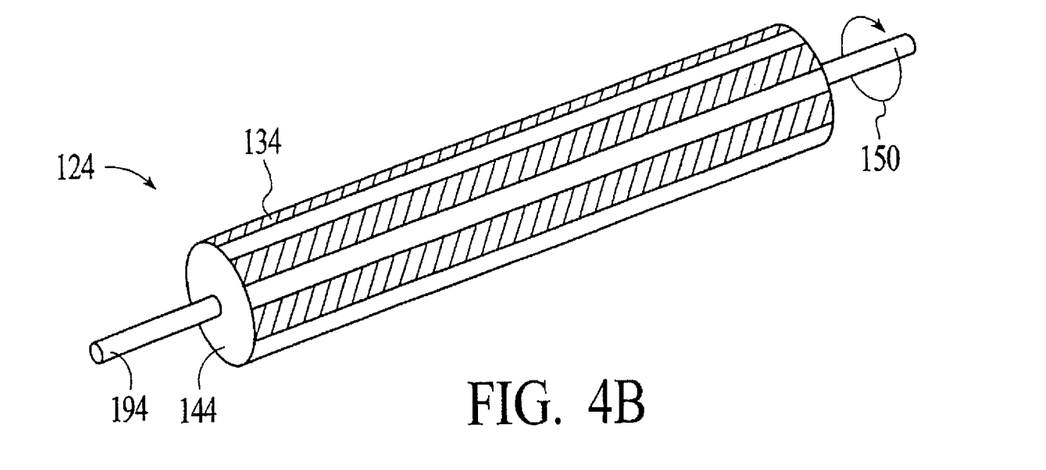

FIG. 4B illustrate a perspective view of a second pad-anode assembly in accordance with the preferred embodiment of the present invention. Again, the anode assembly 124 (120a, 120b, etc. in FIG. 3) includes a unique pad-anode arrangement for plating the workpiece 160. Similar to FIG. 4A, multiple strips of pad 134 (130a, 130b, etc. in FIG. 3) are attached, glued, or machined onto a cylindrical anode 144 (140a, 140b, etc. in FIG. 3) such that the pads 134 protrude from the outer surface of the anode 144. However, in this arrangement, the pads 134 are formed on the anode 144 in a manner such that the pads 134 run along the longitudinal side of the cylindrical anode 144 in a substantially straight manner. This is illustrated in FIG. 4B. The cylindrical anode 144 is further connected to a shaft 194 for rotating about axis 150.

It should be appreciated that many other designs of pad strips can also be used effectively in the present invention. What is important is that these strips cause rigorous stirring of the electrolyte at the workpiece surface. The pad strips described thus far in FIGS. 3, 4A, and 4B are relatively wide (2 to 20 mm). In other embodiments, narrow strips (1 to 2 mm) that are shaped like blades can be used in the present invention. These blades are of a type similar to windshield wiper blades used in automobiles and are made preferably from polymeric materials that are compatible with the plating solution used in the invention. The pad strips may be made of a porous or non-porous polymeric material with or without abrasive particles contained therein. Both the pad strips and blades can be rigid or flexible. What is important is that the pad strips/blades material is stable and can be employed in conjunction with various plating solutions that can be used in this invention.

In another embodiment of the present invention, the pad strips or blades 130a, 130b, etc., in FIG. 3 may be made of a conductive material. In this case, it should be assured that the pad strips or blades 130a, 130b, etc., do not touch the workpiece 160 surface during the plating operation, as described in more detail later herein.

Figure 5:
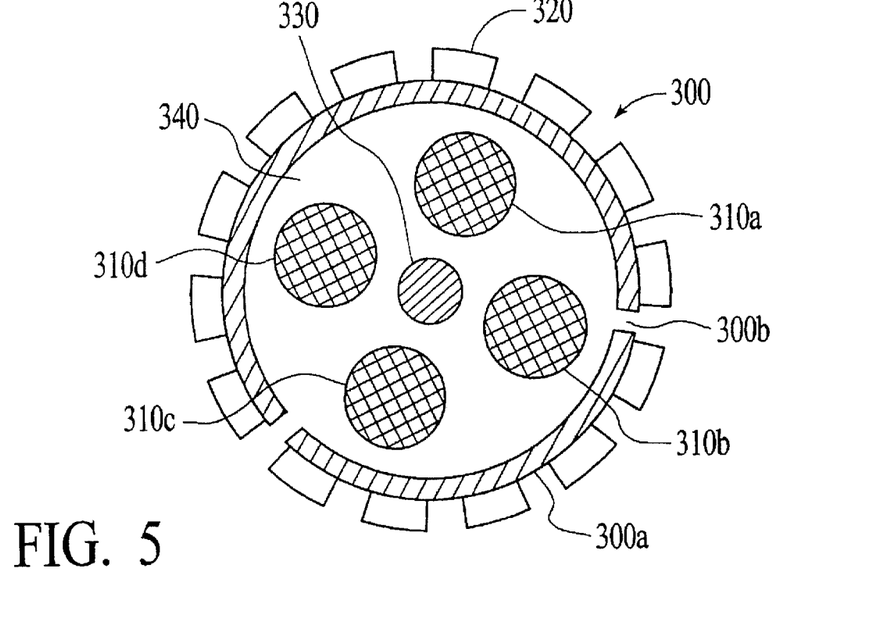
FIGS. 5–6 illustrate cross sectional views of embodiments using anode rods in accordance with the preferred embodiment of the present invention.
Figure 6:
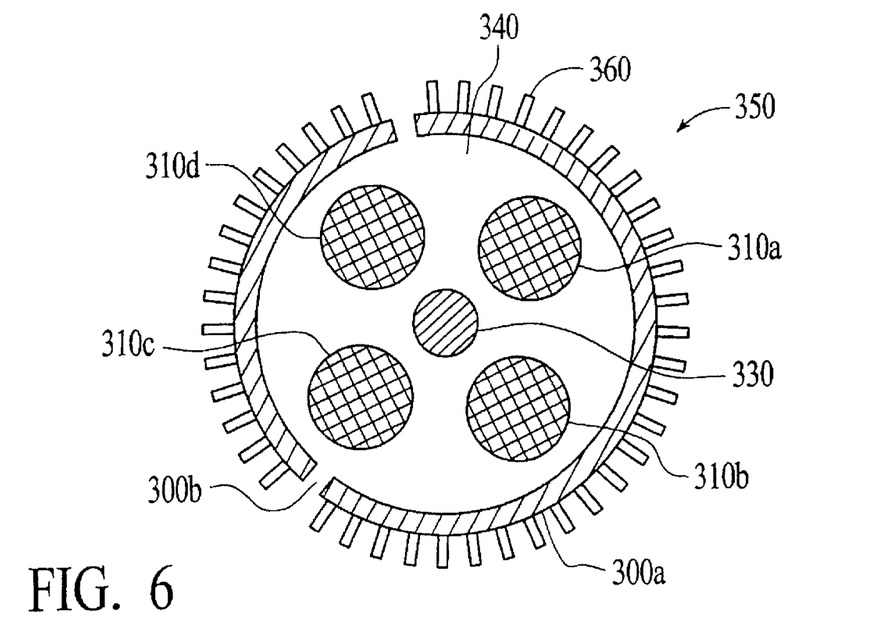

FIGS. 5–6 illustrate cross sectional views of embodiments using anode rods in accordance with the preferred embodiment of the present invention. In these embodiments, rather than having one large cylindrical anode for each anode assembly as shown in FIG. 3, multiple anode rods are enclosed in cylindrical anode assemblies. For example, FIG. 5 illustrates an anode assembly 300 having multiple anode rods 310a, 310b, etc., extending from one end of the assembly 300 to the other end within the cylindrical space contained by the wall 300a. Preferably, the anode rods are between 1 mm to 3 mm in diameter. Although the anode rods 310a, 310b, etc., are schematically shown as not in contact with each other, the anode rods 310a, 310b, etc., may be in contact with each other in other embodiments. Furthermore, anode pellets of various shapes and sizes may be substituted for anode rods in the cylindrical cavity within the walls 300a or a combination of anode rods and pellets may be used.

The anode assemblies of FIGS. 5 and 6 should preferably include pores/holes 300b, as shown herein. The plating solution can enter the cylindrical cavity through the pores/holes 300b, thereby forming an electrical and physical contact between the plating solution and the anode rods/pellets.

The anode assembly 300 also includes pads 320 (130a, 130b, etc. in FIG. 3) as described earlier. A shaft 330 extends through the center of the anode assembly 300 such that the anode assembly 300 may be rotated in a circular motion (either clockwise or counterclockwise). The material 340 surrounding the rods/pellets 310a, 310b, etc, and the shaft 330 is preferably made from an insulating polymeric material. The anode rods/pellets 310a, 310b, etc., are preferably made from the same material that is deposited on the workpiece. For example, for Cu deposition, rods/pellets 310a, 310b, etc., should be preferably made from Cu. The rods/pellets 310a, 310b, etc., may be replaced occasionally as they are in constant use.

FIG. 6 illustrates an anode assembly 350 similar to that of FIG. 5 except blades 360 are used instead of pads 320.

Figure 7:
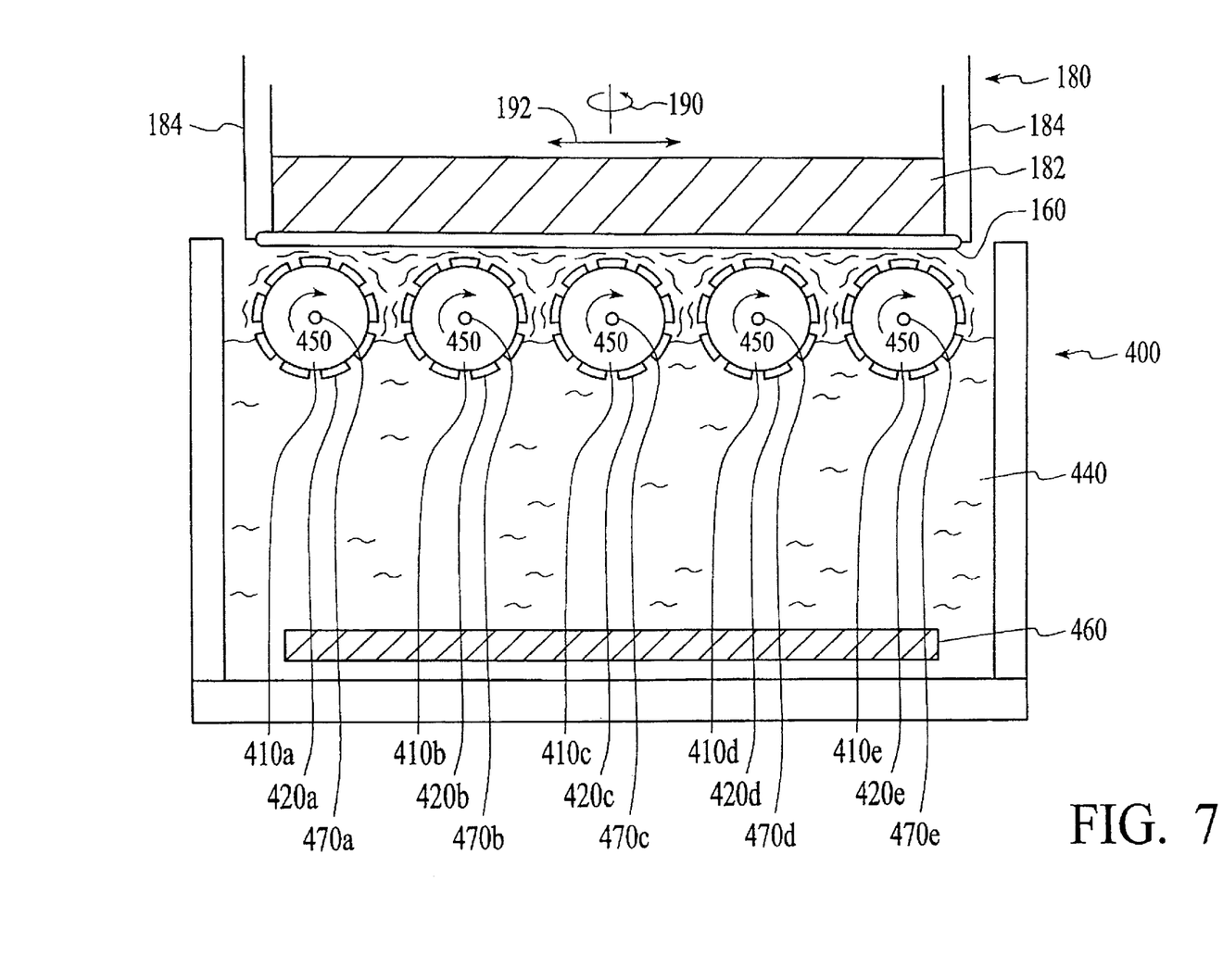
FIG. 7 illustrates a cross sectional view of a "proximity plating" apparatus in accordance with the second preferred embodiment of the present invention.

FIG. 7 illustrates a cross sectional view of another embodiment of the present invention where a separate anode plate is used instead of the cylindrical anodes. A chamber 400 includes one or more cylindrical rollers 410a, 410b, etc., having pad type objects 420a, 420b, etc., attached/mounted thereon. The rollers 410a, 410b, etc., are preferably made from polymeric materials or metals such as Ti that are chemically and mechanically stable in an electrolyte solution 440. The pad type objects 420a, 420b, etc., are attached, mounted, etc. on the rollers 410a, 410b, etc., in a manner similar to that described with reference to FIG. 3.

The chamber 400 includes an anode plate 460 on the bottom of the chamber 400. Any known method for attaching the anode plate 460 to the bottom of the chamber 400 may be used. In the alternative, the anode plate 460 may be positioned at any other location in the chamber 400 so long as it makes physical contact with the electrolyte solution 440. The electrolyte solution 440 in the chamber 400 also makes contact with the pads 420a, 420b, etc. The electrolyte solution 440 can be originally fed into the chamber 400 via a reservoir (not shown) through an in-channel (not shown).

Upon application of power between the workpiece 160 via, for example, contacts 184 and the anode plate 460, and upon rotating one or more rollers 410a, 410b, etc. about axis 450 in either a clockwise or counterclockwise direction, the electrolyte solution 440 is continuously splashed/applied to the workpiece 160 via pads 420a, 420b, etc. Shafts 470a, 470b, etc., are used to rotate the rollers 410a, 410b, etc, respectively. Thus, metal is plated out of the electrolyte solution 440 onto the workpiece 160 surface. As disclosed earlier herein, rollers with blade type objects instead of pads can be used.

In another embodiment of the present invention, the pad/blade 420a, 420b, etc. material in FIG. 7 may be constructed/made from a highly conductive fabric or polymeric material such as polyanilines. In this case, the electric contact 184 to the workpiece 160 is not needed. Instead, an electric contact to the conductive pads/blades 420a, 420b, etc., is provided (not shown). Upon application of power between the anode plate 460 and conductive pads/blades 420a, 420b, etc., and upon rotating the rollers 410a, 410b, etc., in a manner such that the pads/blades 420a, 420b, etc., make contact with the workpiece 160 surface, the electrolyte solution 440 is continuously applied to the workpiece 160, and metal from the electrolyte solution 440 is plated onto the workpiece 160 surface. It should be noted that in this case, cathodic voltage is applied to the workpiece 160 surface using the conductive pads/blades 420a, 420b, etc., as they make contact with the workpiece 160. Metal from the electrolyte solution 440 is plated on the workpiece 160 surface rather than on the conductive pads/blades 420a, 420b, etc., because plating efficiency is much higher on the workpiece 160 surface than on the conductive pads/blades 420a, 420b, etc.

Figure 8:
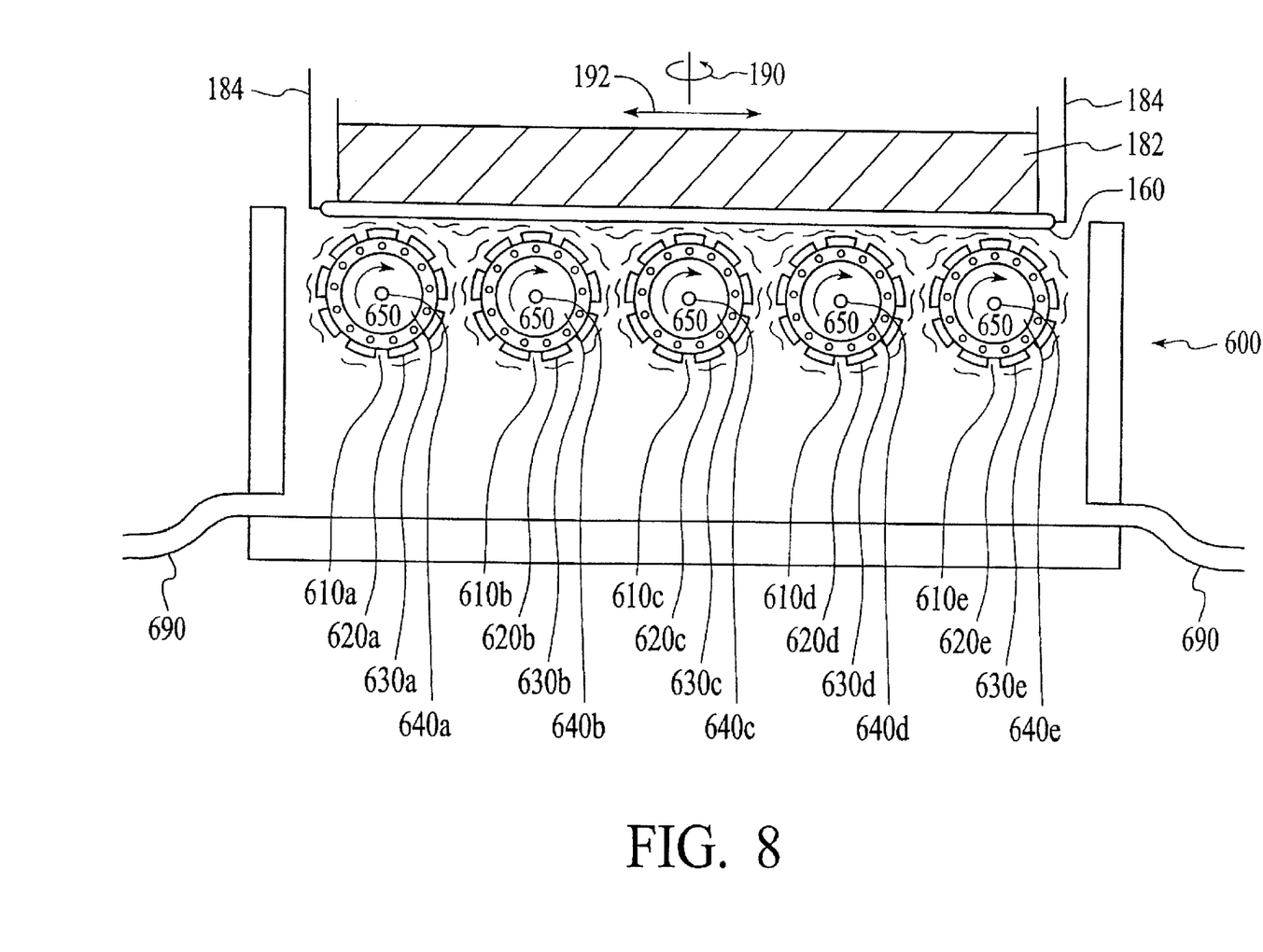
FIG. 8 illustrates a cross sectional view of a "proximity plating" apparatus in accordance with the third preferred embodiment of the present invention.

FIG. 8 illustrates yet an additional embodiment of the present invention. While operating the anode assemblies in FIG. 8, the electrolyte solution can be introduced to the pads or blades from an inlet channel (not shown) located inside or in proximity to the anodes. A chamber 600 includes anode assemblies 610a, 610b, etc., having pad type objects 620a, 620b, etc., attached/mounted on the cylindrical anodes 630a, 630b, etc. Shafts 640a, 640b, etc., are used to rotate the anode assemblies 610a, 610b, etc., about axis 650. In this embodiment, unlike the previous embodiments, an electrolyte solution is not disposed in the chamber 600. The electrolyte solution is flowed through the anode assemblies 610a, 610b, etc., via passageways and holes within the outer periphery of the anodes 630a, 630b, etc., which provide paths for the solution to be fed to the gaps between the anodes 630a, 630b, etc., and the cathode workpiece 160. Alternatively, the electrolyte solution can be dispensed directly onto the anode assemblies 610a, 610b, etc., through another channel (not shown). The electrolyte solution that drops to the bottom of the chamber 600 is flowed out of the chamber 600 via one or more outlet passageways 690. Other means of removing the electrolyte solution from the chamber 600 may be used in accordance with the present invention.

The attractive feature of the design of FIG. 8 is that the apparatus can be operating in a vertical geometry (i.e., apparatus in FIG. 8 rotated by 90 degrees). In other embodiments, a configuration where the anode assemblies 610a, 610b, etc., are positioned over of the cathode workpiece, rather than underneath, can be implemented.

Referring back to the embodiment in FIGS. 7 and 8, the rollers 410a, 410b, etc., having the pad strips 420a, 420b, etc., and the anode assemblies 610a, 610b, etc., should preferably rotate at a rate such that the electrolyte solution is continuously applied/splashed onto the workpiece. The rollers 410a, 410b, etc., or the anode assemblies 610a, 610b, etc., may all rotate in the same clockwise or counterclockwise direction or alternatively, some may rotate in one direction (i.e., clockwise) while others may rotate in the opposite direction (i.e., counterclockwise). Further, during operation, one, two, three, . . . , or all rollers 410a, 410b, etc., or anode assemblies 610a, 610b, etc., may be activated concurrently and/or voltages may be applied to all or only a selected number of them (only anode assemblies 610a, 610b, etc.). In addition, the length of the rollers 410a, 410b, etc., and the anode assemblies 610a, 610b, etc., may all be the same or they may be different.

In all embodiments described herein, the hardness of the pad or blade type objects is related to the relative speed of rotation of the pads or blades with respect to the workpiece.

Although both DC and pulsed power supplies can be used to apply power to the anode(s) and the workpiece, the present invention may reduce the need for pulse generating power supplies because the mechanical pulsing that is generated from the movement of the pads or blades relative to the face of the workpiece creates sufficient pulsing. This mechanical pulsing is created as a result of the workpiece being in proximity with the pads or blades as it is moved in relation to the workpiece. The benefit of the mechanical pulsing is that it improves grain size, filling efficiency of the contact holes, vias, and trenches, and copper film integrity without the need for power supplies with pulsing capabilities.

In additional to the mechanical pulsing, the anode assemblies disclosed herein can provide electrical pulsing. If the pad and/or blade materials are insulating, then the plating current density decreases as the cylindrical anode is rotating when the pad and/or blades are in their closest distance to the workpiece surface. On the other hand, when the pad/blade is not in their closest distance to the workpiece surface (i.e., the gaps in between each pad/blade) as the cylindrical anode is rotated, then the current density increases. Such pulsing is found to be beneficial for forming a high quality material on the workpiece surface.

Although deposition of a conductive material has so far been described hereinabove, those skilled in the art can use the teachings herein for etching and electroetching processes. For example, if the voltage applied between the workpiece and the anode(s) is such that the workpiece is more negative than the anode(s), then plating on the workpiece surface occurs. If the voltage is zero, then chemical etching of the conductive material on the workpiece surface occurs. If the polarity voltage is reversed, then electroetching of the conductive material from the workpiece surface can be initiated. Alternately, the apparatus disclosed herein can be used for electroless deposition of materials such as Cu, Ni, Ni-P, Co, etc. In this case, an electroless deposition solution is used rather than the electrodeposition electrolyte solution.

Although the embodiments shown thus far illustrate one workpiece, it is understood that more than one workpiece head assembly could be used with the present invention. Furthermore, each chamber described above may include various numbers of anode/roller assemblies so long as they can effectively plate a conductive layer on a workpiece surface.

In the previous descriptions, numerous specific details are set forth, such as specific materials, structures, chemicals, processes, etc., to provide a thorough understanding of the present invention. However, as one having ordinary skill in the art would recognize, the present invention can be practiced without resorting to the details specifically set forth.

Although only the above embodiments have been described in detail above, those skilled in the art will readily appreciate that many modifications of the exemplary embodiment are possible without materially departing from the novel teachings and advantages of this invention.

I claim:

1. An apparatus for depositing a conductive material on a surface of a workpiece, comprising:
   a workpiece head assembly adapted to support the workpiece; and
   a chamber having:
      a plurality of anode assemblies, wherein each anode assembly is adapted to rotate in a circular direction and includes an anode and one or more pad or blade strips attached to an outer surface of the anode; and
   wherein the chamber is adapted to hold an electrolyte solution including the conductive material, the electrolyte solution adapted to be applied to the surface of the workpiece upon rotating the plurality of anode assemblies.

2. The apparatus according to claim 1, wherein the anode comprises a cylindrical anode.

3. The apparatus according to claim 2, wherein the cylindrical anode comprises a hollow cylinder.

4. The apparatus according to claim 3, wherein the cylindrical anode comprises one of carbon and titanium.

5. The apparatus according to claim 4, wherein the cylindrical anode comprises a diameter between 10 to 30 mm.

6. The apparatus according to claim 1, wherein the one or more pad or blade strips are wrapped around the outer surface of the cylindrical anode.

7. The apparatus according to claim 1, wherein the one or more pad or blade strips are attached to the outer surface of the anode along a longitudinal side of the cylindrical anode.

8. The apparatus according to claim 1, wherein the workpiece head assembly is further adapted to move up and down and side to side.

9. The apparatus according to claim 1, wherein the workpiece head assembly is further adapted to rotate in a clockwise or counterclockwise direction.

10. The apparatus according to claim 1, wherein the one or more pad strips include widths that are 2–20 mm.

11. The apparatus according to claim 1, wherein the one or more blade strips include widths that are 1–2 mm.

12. The apparatus according to claim 1, wherein the one or more pad strips comprise one of porous, non-porous, conductive, and non-conductive material.

13. The apparatus according to claim 12, wherein the one or more pad strips further include abrasive particles.

14. The apparatus according to claim 1, wherein the anode comprises one of a plurality of anode rods and a plurality of anode pellets.

15. The apparatus according to claim 14, wherein the plurality of anode assemblies further includes a plurality of holes.

16. The apparatus according to claim 1, wherein the workpiece comprises one of a wafer, a flat panel, and a magnetic film head.

17. An apparatus for depositing a conductive material on a surface of a workpiece, comprising:
   a workpiece head assembly adapted to support the workpiece; and
   a chamber having:
      a plurality of anode assemblies, wherein each anode assembly is adapted to rotate in a circular manner and includes an anode, one or more pad or blade strips attached to an outer surface of the anode, and means for introducing an electrolyte solution having the conductive material to the one or more pad or blade strips such that the conductive material is applied to the surface of the workpiece upon rotating the plurality of anode assemblies.

18. The apparatus according to claim 17, wherein the anode comprises a cylindrical anode.

19. The apparatus according to claim 18, wherein the one or more pad or blade strips are wrapped around the outer surface of the cylindrical anode.

20. The apparatus according to claim 18, wherein the one or more pad or blade strips are attached to the outer surface of the anode along a longitudinal side of the cylindrical anode.

21. The apparatus according to claim 17, wherein the workpiece head assembly is further adapted to move up and down and side to side.

22. The apparatus according to claim 17, wherein the workpiece head assembly is further adapted to rotate in a clockwise or counterclockwise direction.

23. The apparatus according to claim 17, wherein the one or more pad strips include widths that are 2–20 mm.

24. The apparatus according to claim 17, wherein the one or more blade strips include widths that are 1–2 mm.

25. The apparatus according to claim 17, wherein the one or more pad strips comprise one of porous, non-porous, conductive and non-conductive material.

26. The apparatus according to claim 25, wherein the one or more pad strips further include abrasive particles.

27. The apparatus according to claim 17, wherein the means for introducing the electrolyte solution comprises passageways and holes in the plurality of anode assemblies.

28. The apparatus according to claim 17, wherein the workpiece comprises one of a wafer, a flat panel, and a magnetic film head.

29. The apparatus according to claim 17, wherein the electrolyte solution comprises an electroless deposition solution.

30. The apparatus according to claim 29, wherein the electroless deposition solution comprises one of Cu, Ni, NI-P, and Co.

* * * * *

UNITED STATES PATENT AND TRADEMARK OFFICE
CERTIFICATE OF CORRECTION

PATENT NO. : 6,630,059 B1
DATED : October 7, 2003
INVENTOR(S) : Cyprian E. Uzoh et al.

It is certified that error appears in the above-identified patent and that said Letters Patent is hereby corrected as shown below:

<u>Title page, Item [54] and Column 1, line 1,</u>
Title, "WORKPEICE" should read -- WORKPIECE --.

Signed and Sealed this

Eleventh Day of May, 2004

JON W. DUDAS
*Acting Director of the United States Patent and Trademark Office*